United States Patent [19]

Barlow et al.

[11] Patent Number: 4,490,629
[45] Date of Patent: Dec. 25, 1984

[54] HIGH VOLTAGE CIRCUITS IN LOW VOLTAGE CMOS PROCESS

[75] Inventors: Allen R. Barlow; Corey Petersen, both of Pocatello, Id.

[73] Assignee: American Microsystems, Inc., Santa Clara, Calif.

[21] Appl. No.: 376,903

[22] Filed: May 10, 1982

[51] Int. Cl.$^3$ ............... H03K 19/003; H03K 19/094; H03K 19/092; H03K 17/10
[52] U.S. Cl. .................................. 307/451; 307/446; 307/570; 307/579; 307/585; 357/23
[58] Field of Search ............... 307/200 B, 446, 451, 307/570, 576, 579, 585, 475, 264, 304; 357/23 HV

[56] References Cited

U.S. PATENT DOCUMENTS

| | | | |
|---|---|---|---|
| 3,991,326 | 11/1976 | Kawagoe et al. | 307/451 X |
| 4,161,663 | 7/1979 | Martinez | 307/200 B X |
| 4,172,260 | 10/1979 | Okabe et al. | 357/23 HV |
| 4,296,335 | 10/1981 | Simcoe | 307/200 B |
| 4,313,065 | 1/1982 | Yoshida et al. | 307/585 |
| 4,317,055 | 2/1982 | Yoshida et al. | 307/584 X |
| 4,429,237 | 1/1984 | Cranford, Jr. et al. | 307/200 B X |

OTHER PUBLICATIONS

Heisig, "Bimos-A New Way to Simplify High-Power Custom Interface", Proceeding of 1981 CICC, pp. 8–12.
Yamaguchi et al., "Process and Device Design of a 1000-Volt MOS IC", IEDM Tech. Dig., pp. 255–258, (1981).
Buhler et al., "Integrated High Voltage/LOS Voltage MOS Devices", IEDM Tech. Dig., pp. 259–262, (1981).

Primary Examiner—Stanley D. Miller
Assistant Examiner—David R. Hudspeth
Attorney, Agent, or Firm—Alan H. MacPherson; Steven F. Caserza; Thomas S. MacDonald

[57] ABSTRACT

A CMOS push-pull output buffer (171) is constructed utilizing a plurality of N channel transistors (74, 75, 76) and a plurality of P channel transistors (71, 72, 73) connected in series. The voltages applied to the gates of the N channel transistors and P channel transistors are selected to divide the high voltage (+V) substantially equally across the P channel transistors, when the P channel transistors are turned off, and substantially evenly divide the high voltage across the N channel transistors, when the N channel transistors are turned off.

In another embodiment of this invention, selected ones of the N channel and P channel transistors are formed in order to have a high drain to bulk breakdown voltage.

In another embodiment of this invention, a plurality of N channel and a plurality of P channel transistors are connected in series and driven by a single ended control voltage ($C_N$), thus providing a first stage (101) which drives a second stage (100) having a plurality of P channel transistors and a plurality of N channel transistors (110, 111, 112), which provide the high voltage output voltage.

In another embodiment of this invention, the first stage (101) is driven by a single ended control voltage ($C_N$) and serves to drive a second stage (103) comprising a plurality of N channel transistors (110, 111, 112) and a plurality of bipolar transistors (120, 121), whereby said second stage provides the high voltage output signal.

17 Claims, 8 Drawing Figures

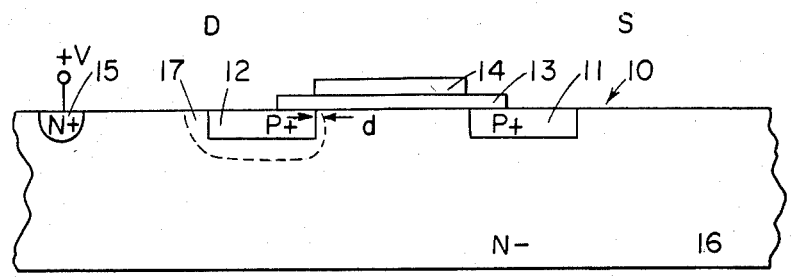
FIG.1a PRIOR ART
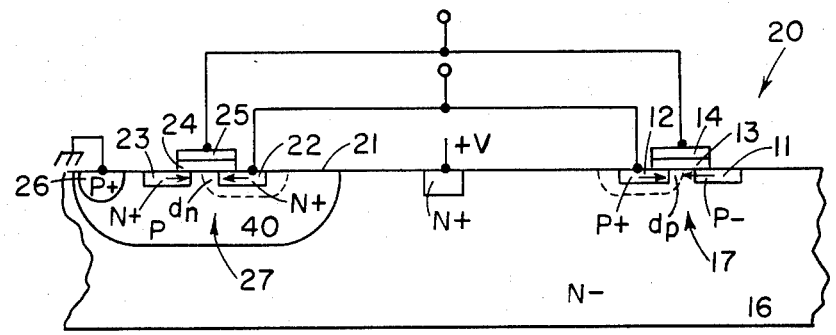
FIG.2b PRIOR ART
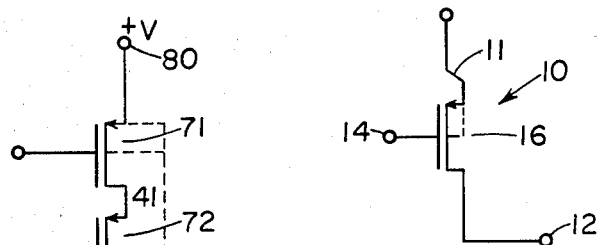
FIG.1b PRIOR ART
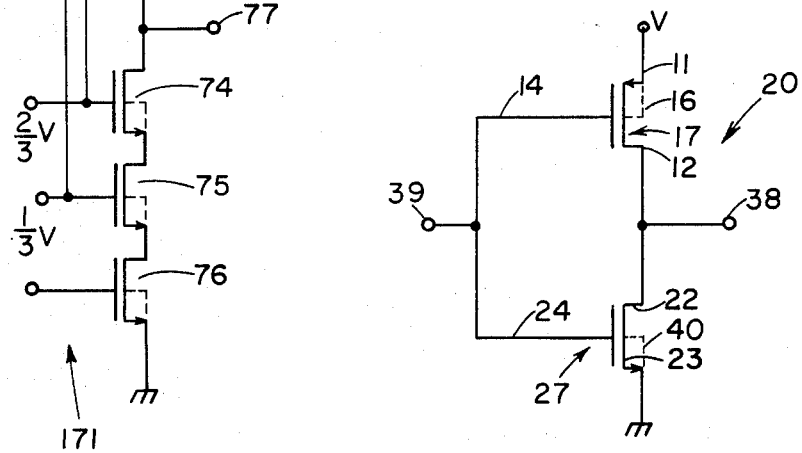
FIG.3
FIG.2a PRIOR ART

HIGH VOLTAGE CIRCUITS IN LOW VOLTAGE CMOS PROCESS

BACKGROUND OF THE INVENTION

1. Field of the Invention

This invention relates to integrated circuit devices and more particularly to techniques and structures for forming integrated circuit devices intended for low voltage operation but which are able to switch substantially higher voltages and which are fabricated utilizing standard processes.

2. Description of the Prior Art

Integrated circuit devices are well known in the prior art. A cross-sectional view of a P channel device is shown in FIG. 1a. P channel device 10 is formed in N— substrate 16 and includes P+ type source 11 and P+ type drain 12. Formed above and between source 11 and drain 12 is gate oxide 13 and thereupon is formed gate 14. N+ type contact 15 is formed to allow electrical connection to substrate 16. A schematic diagram of the structure of FIG. 1a when utilized as an open drain output buffer is shown in FIG. 1b. Substrate 16 is connected to source 11 which in turn is connected to a source of positive voltage V, thereby preventing the PN junctions formed between the source and the substrate, and between the drain and the substrate from becoming forward biased. Drain 12 serves as the output terminal of the device. Gate 14 receives an input signal which controls the operation of transistor 10, thus determining the output voltage available on terminal 12. With a logical 0 signal (typically 0 volts) applied to gate 14, P channel transistor 10 turns on, thus connecting the positive voltage V to output terminal 12. Conversely, a logical 1 signal (typically V) applied to gate 14 causes transistor 10 to turn off, thus not supplying a voltage to terminal 12.

With transistor 10 turned off (i.e., a logical 1 applied to gate 14) and drain 12 connected through an external load device (not shown) to ground, a depletion region 17 forms surrounding drain 12 (FIG. 1a) in which the free charge carriers are depleted. In other words, electrons are forced away from drain 12 due to its relatively low voltage with respect to substrate 16 which, as previously described, is connected to V. However, near gate 14, which is connected to positive voltage V, electrons are attracted, thereby reducing the width of the depletion region to width d as shown on FIG. 1a. Thus, for an increasing voltage differential between drain 12 and substrate 16, and thus a descreasing distance d, the electric field between drain 12 and substrate 16 increases. For a sufficiently high electric field between drain 12 and substrate 16, the PN junction formed between drain 12 and substrate 16 (substrate 16 is also referred to as the bulk silicon with respect to P channel transistor 10) breaks down under reverse-bias, and current flows from substrate 16 (connected to V) to drain 12 (connected to ground through the external load device, not shown). This phenomenon is hereinafter referred to as the drain to bulk reverse-bias breakdown.

Another type of output buffer is shown in the schematic diagram of FIG. 2a. The complementary metal oxide silicon (CMOS) Push-Pull output buffer 20 includes P channel MOS transistor 17 having its source connected to a positive voltage supply (V), its drain connected in common with the drain of N channel MOS transistor 27, and its gate 14 connected to input terminal 39. Similarly, the gate of N channel transistor 27 is connected to input terminal 39, and the source 23 of N channel transistor 27 is connected to ground. Output terminal 38 is provided between the drain 12 and drain 22 of MOS transistors 17 and 23, respectively. With a logical 0 signal (typically 0 volts) applied to input terminal 39, P channel transistor 17 turns on and N channel transistor 27 turns off, thus providing a voltage substantially equal to V on output terminal 38. Conversely, with a logical 1 signal (typically 5 volts) applied to input terminal 39, P channel transistor 17 turns off and N channel transistor 27 turns on, thus effectively grounding output terminal 38 through transistor 27. Thus output buffer 20 can, alternatively, source current to output terminal 38 from voltage source V, or sink current from output terminal 38 to ground. Hence, output buffer is referred to as a CMOS push-pull output buffer.

A cross-sectional view of one structure which provides the circuit of FIG. 2a is shown in FIG. 2b. As previously described, the drain to bulk reverse-bias breakdown voltage of P channel transistor 17 prevents the switching of high voltages. A similar problem with the drain 22 to P well 40 (P well 40 serves as the bulk silicon for N channel transistor 27) reverse-bias breakdown voltage is present in N channel transistor 27. In typical prior art CMOS logic devices utilizing push-pull output buffers, the reverse-bias breakdown voltage between P well 40 and drain 24 is approximately 15 volts. Thus, referring again to FIG. 2a, with a voltage in excess of the drain to bulk reverse-bias breakdown voltage applied as the positive supply voltage V, P channel transistor 17 will conduct current from substrate 16 (connected to V) to drain 12 when transistor 17 is turned off, thus providing an undesirable high voltage on output terminal 38. Similarly, with a high voltage in excess of the drain to bulk reverse-bias breakdown voltage applied to output terminal 38 (i.e. through a conducting transistor 17), transistor 27 will conduct current from drain 22 to P well 40 (connected to ground) when turned off, thus providing an undesirable current path between output terminal 38 and ground. Thus, the undesirable drain to bulk reverse-bias breakdown of transistors 17 and 40 provides incorrect voltage levels on output terminal 38, high power dissipation, and often results in irreversable damage to transistors 17 and 40, thus destroying the integrated circuit device.

One prior art technique for eliminating the problem of reverse-bias bulk to drain breakdown when switching high voltages is to develop a more complex fabrication process which increases the bulk to drain reverse-bias breakdown voltage. Such special processing techniques are described, for example, by Heisig in an article entitled "BIMOS—A New Way to Simplify High Power Custom Interface", Proceedings of 1981 CICC, pp. 8-12; Yamaguchi et al., "Process and Device Design of a 1000 Volt MOS IC,", IEDM Technical Digest, 1981, pp. 255-258; and Buhler et al., "Integrated High-Voltage/Low Voltage MOS Devices", IEDM Technical Digest, 1981, pp. 259-262, each of which is hereby incorporated by reference.

Another attempt to minimize the effect of the undesirable bulk to drain reverse-bias breakdown voltage is described by Yoshida, et al, in U.S. Pat. No. 4,317,055, issued Feb. 23, 1982, and which is hereby incorporated by reference. As shown in their FIG. 13, for example, Yoshida et al utilize a plurality of MOS transistors Q1 through Qn, each of which has a relatively low drain to bulk reverse-bias breakdown voltage. This plurality of MOS transistors are connected having their drains and sources connected in series with the source of Q1 connected to ground, and the drain of Qn connected to the output terminal (D). A first resistive voltage divider is formed by resistors R(N+1) through R2n between a positive bias voltage VB and ground, with each node of the first resistive voltage divider being connected through one of a plurality of diodes $d_1$ through $d(n-1)$ to the gates of all transistors with the exception of Q1. The gate of transistor Q1 receives the control signal which controls the state (on or off) of transistor Q1. The Yoshida, et al structure also utilizes a second resistive voltage divider formed by resistors R1 through Rn, which is connected between the output terminal (D) and ground. Each node of this second resistive voltage divider is connected to the control gate of an associated transistor, with the exception of transistor Q1. This second resistive voltage divider is used to increase the gate voltages on transistors Q2 through Qn when the voltage applied to the output terminal (D) by external devices (not shown) exceeds the bias voltage VB. Diodes $d_1$ through $d(n-1)$ are required to prevent this high external voltage from being applied to other devices (not shown) within the integrated circuit device.

Of importance, the Yoshida et al structure requires a substantial amount of components in addition to transistors Q1 through Qn in that Yoshida et al require two separate voltage dividers and a plurality of diodes for each output terminal of their integrated circuit device. Furthermore, because one of the resistive ladder dividers of each of Yoshida's output buffers is connected between the output terminal (D) and ground, the Yoshida, et al structure provides a finite DC impedance to the external circuitry (not shown) connected to the output terminal D when the output stage is turned off. Often this is not acceptable. Thirdly, Yoshida, et al structure is an open drain output buffer and thus does not provide an output terminal which is capable of both sinking current or, alternatively, sourcing current.

SUMMARY

In accordance with this invention, a CMOS push-pull output buffer is constructed utilizing a plurality of N channel transistors and a plurality of P channel transistors connected in series. The voltages applied to the gates of the N channel transistors and P channel transistors are selected to divide the high voltage substantially equally across the P channel transistors, when the P channel transistors are turned off, and substantially evenly divide the high voltage across the N channel transistors, when the N channel transistors are turned off.

In another embodiment of this invention, selected ones of the N channel and P channel transistors are formed in order to have a high drain to bulk breakdown voltage.

In another embodiment of this invention, a plurality of N channel and a plurality of P channel transistors are connected in series and driven by a single ended control voltage, thus providing a first stage which drives a second stage having a plurality of P channel transistors and a plurality of N channel transistors, which provide the high voltage output voltage.

In another embodiment of this invention, the first stage is driven by a single ended control voltage and serves to drive a second stage comprising a plurality of N channel transistors and two bipolar transistors, whereby said second stage provides the high voltage output signal.

BRIEF DESCRIPTION OF THE DRAWINGS

FIG. 1a is a cross-sectional view of the prior art P channel MOS transistor;

FIG. 1b is a schematic diagram of a P channel MOS transistor used in an open drain output buffer configuration;

FIG. 2a is a schematic diagram of a prior art CMOS push-pull output buffer;

FIG. 2b is a cross-sectional view of the CMOS structure of FIG. 2a;

FIG. 3 is a schematic diagram of a high voltage CMOS push-pull output buffer constructed in accordance with one embodiment of this invention;

DETAILED DESCRIPTION

Figure 4:
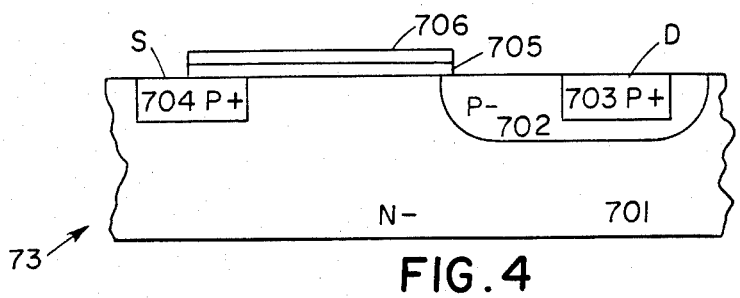
FIG. 4 is a cross-sectional view of a high voltage P channel transistor utilized in the circuit shown in FIG. 3.

An output buffer constructed in accordance with one embodiment of this invention is shown in the schematic diagram of FIG. 3. As shown in FIG. 3, P channel transistors 71, 72, and 73 are connected in series between terminal 80, which receives a positive voltage V, and output terminal 77. Similarly, N channel transistors 74, 75 and 76 are connected in series between output terminal 77 and ground. When the structure of FIG. 3 is constructed in an N type substrate, and P channel transistors are fabricated in the N type sybstrate (i.e. not in a plurality of separate N wells), the N type substrate is connected to terminal 80 as shown by the dashed lines of transistors 71, 72 and 73. By connecting the N type substrate to V, the PN junctions formed between the P type sources of transistors 71, 72 and 73 and the N type substrate are reverse biased, thus preventing forward conduction of current therebetween. Alternatively, each P channel transistor 71, 72 and 73 can be formed in individual N wells separated by a P type region, in which case it would be preferable to connect each such N well to the source of its associated P channel transistor formed therein.

Similarly, when the embodiment of this invention shown in FIG. 3 is constructed in an N type substrate, N channel transistors 74, 75 and 76 are preferably each formed in separate P type well regions, with each P type well region being connected to the source of its associated transistor, as shown by the dashed lines of transistors 74, 75 and 76. Thus, the voltage difference between the drain and P well of N channel transistors 74, 75 and 76 is minimized, thus preventing drain to bulk reverse bias breakdown. Of importance, it is oftentimes not necessary or possible to form each of the P channel transistors 71, 72 and 73 in their own individual N wells because P channel transistors typically have a higher drain to bulk reverse-bias breakdown voltage than their N channel counterparts due to the fact that P—well 40 is more highly doped than the N type substrate 16. Furthermore, a unique high voltage P channel transistor 73 is utilized which has a substantially higher bulk to drain reverse-bias breakdown voltage than its counterpart P channel transistors 71 and 72 which are fabricated using standard transistor structures.

The high voltage P channel transistor 73 is formed in N type substrate 701, as shown in the cross-sectional view of FIG. 4. High voltage P channel transistor 73 includes P+ source region 704 and P+ drain region 703. P+ drain region 703 is formed within a P−well 702. It is necessary to form P+ source and drain regions 704 and 703 of heavily doped P type material in order to provide low resistivity connections to the electrical interconnects (not shown). P−well region 702 is utilized to form a P−/N− junction between P−well 702 and N− substrate 701, thus providing a higher breakdown voltage between P−well 702 and N−substrate 701 as compared with what the PN breakdown voltage would be between P+ drain 703 and N− substrate 701 if P−well region 702 is not used, thus allowing transistor 73 to have a higher drain to bulk reverse-bias breakdown voltage than typical P channel transistors, such as transistor 10 of FIG. 1a. Gate oxide layer 705 and control gate 706 form the remaining elements of high voltage P channel transistor 73.

If required in order to allow proper switching of high voltages by the output buffer shown in FIG. 3 without the undesired effects of drain to bulk reverse bias breakdown of the P channel transistors 71 and 72, P channel transistors 71 and 72 can also be formed as high voltage P channel devices as shown in FIG. 4. Furthermore, P+ source 704 of each high voltage P channel transistor utilized can also be surrounded by a P−well region (not shown) if required to provide a higher PN reverse bias breakdown voltage between source 704 and substrate 701, thus allowing source 704 to operate at a voltage in excess of the PN breakdown voltage of the junction formed between P+ type source 704 and N− substrate 701 when such a P well region surrounding source 704 is not used.

In a similar manner, N channel transistors 74, 75 and 76 can, if desired, be formed as high voltage N channel devices by surrounding one or both of their N+ source and drain regions with an N− region, thus providing an increased reverse bias breakdown voltage between the N− well region and the P well within which the N channel transistor is formed.

The control gates of P channel transistor 72 and N channel transistor 74 are connected to a bias voltage which is selected so as to prevent the depletion regions surrounding the drains of P channel transistor 72 and N channel transistor 74 from decreasing to a distance which will allow the drain to bulk reverse-bias breakdown voltage of transistors 72 and 74 from being less than the voltage imposed across the drain to bulk of these transistors. Similarly, the control gates of high voltage P channel transistor 73 and N channel transistor 75 are connected to a second bias voltage which is selected so as to prevent the depletion regions surrounding the drains of P channel transistor 73 and N channel transistor 75 from decreasing to a distance which will allow the drain to bulk reverse-bias breakdown voltage of transistors 73 and 75 from being less than the voltage imposed across the drain to bulk of these transistors. In other words, a bias voltage which is less positive than the voltage V applied to the P channel bulk is applied to the gates of P channel transistors 72 and 73, and a bias voltage is more positive than the voltage (ground) applied to the N channel bulk is applied to the gates of N channel transistors 74 and 75. Preferably, the bias voltages applied to the gates of transistors 72 and 73 are selected in order to cause the high voltage V to be substantially evenly divided across the channels of each of transistors 71, 72, and 73 when they are turned off (and thus output terminal 77 is grounded through conducting transistors 74, 75 and 76). Similarly, the bias voltages applied to the gates of transistors 74 and 75 are preferably selected in order to cause the positive voltage V to be substantially evenly divided across transistors 74, 75 and 76 when they are turned off, (i.e., when terminal 77 is at V because transistors 71, 72 and 73 are turned on).

When the control voltage applied to the gates of transistors 71 and 76 is high (typically 5 volts on the gate of transistor 76, and typically V on the gate of transistor 71), thus turning transistors 71, 72 and 73 off (and the control voltage applied to the gate of transistor 76 is also high, thus turning transistors 74, 75 and 76 on), a voltage of approximately V/3 applied to the gate of transistor 73 will cause the source of transistor 73 to reach a voltage of approximately $(V/3) + V_T$, one threshold voltage above the gate voltage of transistor 73.

Similarly, with a voltage of approixmately 2 V/3 applied to the gate of transistor 72, the source of transistor 72 will be at a voltage of approximately $(2 V/3) + V_T$, one threshold voltage above the gate voltage of transistor 72. Naturally the voltage on the source of transistor 71 remains at V, and thus the voltage V is substantially evenly divided across the channels of transistors 71, 72 and 73.

With a low control voltage (typically 0 volts) applied to the gate of transistor 76, thus causing transistors 74, 75 and 76 to turn off and a low control voltage (typically V−5 volts) applied to the gate of transistor 71, thus causing transistors 71, 72 and 73 to turn on, output terminal 77 is at a voltage substantially equal to V. In this situation, a voltage of approximately V/3 applied to the gate of transistor 75 causes the voltage on the source of transistor 75 to be equal to approximately $(V/3) - V_T$, one threshold voltage less than the voltage on its control gate. Similarly, with a voltage of approximately 2 V/3 applied to the control gate of transistor 74, the voltage on the source of transistor 74 is approximately $(2 V/3) - V_T$, one threshold voltage below the voltage on the gate of transistor 74.

Thus, by carefully selecting the magnitude of the voltages applied to the gates of transistors 72, 73, 74 and 75, the high voltage supply V is substantially evenly divided across transistors 71, 72 and 73 when they are turned off and will be substantially evenly divided across transistors 74, 75 and 76 when they are turned off, thus preventing breakdown of transistors 71, 72, 73, 74, 75 and 76.

Figures 5, 6:
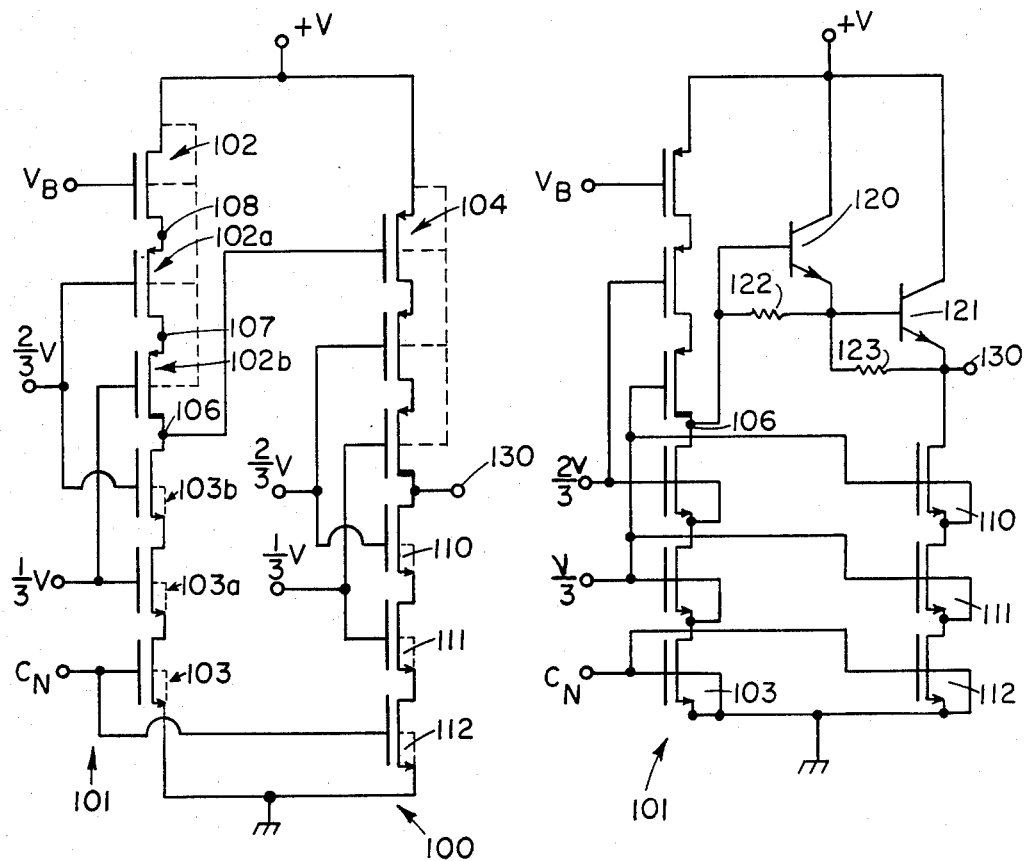
FIG. 5 is a schematic diagram of a high voltage CMOS push-pull output buffer which is driven by a single ended CMOS voltage translation stage which is constructed in accordance with this invention.
FIG. 6 is a schematic diagram of a combined MOS/bipolar high voltage output stage which is driven by a single ended CMOS voltage translation stage constructed in accordance with this invention.

Another embodiment of an output buffer constructed in accordance with this invention is shown in the schematic diagram of FIG. 5. Output buffer 100 of the circuit of FIG. 5 is identical to the output buffer 171 of FIG. 3. However, the output buffer 100 of FIG. 5 is driven by voltage level translating circuitry 101. Level translating circuitry 101 is constructed in a similar manner as Push-Pull output stage 100 with the exception that the transistors of level translating stage 101 need not be capable of handling large currents and thus can be made smaller, thus conserving valuable area on the semiconductor substrate surface, as well as reducing power dissipation. Furthermore, P channel transistors 102 has its gate connected to a bias voltage $V_B$ which establishes the current which will flow through the transistors of level translating stage 101 when the single control voltage $C_N$ applied to the gate of N channel 103 is a logical 1, thus causing the transistors of level translating stage 101 to conduct. (A single ended control voltage $C_N$ is either a logical 0 or a logical 1, in contrast with double ended control voltages $C_N$ and $\overline{C_N}$ which provide a logical 0 and logical 1, or a logical 1 and a logical 0, respectively, at any given time.)

P channel transistor 104 of output buffer 100 is driven by the signal available on output node 106 of level translating stage 101 and N channel transistor 105 is controlled by the single-ended control voltage $C_N$. Thus, by utilizing the level translating stage 101, the high voltage output stage 100 is driven as a CMOS Push-Pull output buffer from a single-ended control signal $C_N$. Alternatively, the gate of P type transistor 104 can be driven from either nodes 107 or 108; however, in this event, transistor 104 will receive a more positive gate voltage from nodes 107 and 108, respectively, when control signal $C_N$ is a logical 0 than it would receive when connected to node 106. Accordingly, when the gate of transistor 104 is connected to either node 107 or 108, transistor 104 must be fabricated in such a manner that transistor 104 will conduct a greater amount of current with a more positive voltage corresponding to a logical 0 (i.e. when transistors 102, 102a and 102b are off and transistors 103, 103a and 103b are on) on its control gate as compared to the structure where the gate of transistors 104 is driven by node 106 (i.e. a logical zero on node 106 corresponds to ground). However, transistor 104 will still turn off when the high voltage V is available on its control gate (i.e., when transistors 103, 103a and 103b are is turned off and transistors 102, 102a and 102b are turned on), because at this time nodes 106, 107 and 108 are all at V and the source of transistor 104, connected to V, will never be at a higher potential than the gate of transistor 104.

Another embodiment of a high voltage Push-Pull output buffer constructed in accordance with this invention is shown in the schematic diagram of FIG. 6. Single-ended voltage translation stage 101 operates in an identical manner as the single-ended voltage translation stage 101 of FIG. 5, previously described. Similarly, the N channel transistors 110, 111 and 112 of the high voltage Push-Pull output stage 103 operate in a similar manner as the N channel transistors 110, 111, and 112 of the high voltage Push-Pull output stage 100 of FIG. 5, as previously described. However, node 106 of voltage translation stage 101 drives the base of NPN transistor 120. The output signal from the emitter of NPN transistor 120 in turn drives the base of NPN transistor 121 whose emitter is connected to output terminal 130. Thus, NPN transistors 120 and 121, when turned on, provide a source of current from the high voltage V to output terminal 130, while N channel transistors 110, 111 and 112 remain turned off. Similarly, N channel transistors 110, 111 and 112, when on, sink current from output terminal 130 to ground, while NPN transistors 120 and 121 remain off. Resistors 122 and 123 are connected between the base and emitter of transistors 120 and 121, respectively, and serve to prevent a current punchthrough between the emitter and collector of the NPN transistors which may occur when the base is left floating (i.e. when transistor 103 is turned off). Of importance, NPN transistors 120 and 121 are easily fabricated during the course of fabricating CMOS devices, and thus no additional processing steps are required to implement this embodiment of our invention.

In addition, because the integrated circuit device constructed in accordance with this invention is required to operate at very high operating voltages (typically 60 volts or more), it is important to insure that parasitic transistors are not formed when a conductive interconnect is formed on field oxide above two adjacent diffused regions, where the conductive interconnect serves as the gate of a parasitic field effect transistor. In accordance with another feature of this invention, such parasitic transistors are eliminated by the use of guard rings of opposite conductivity type which are placed between adjacent diffused regions of similar conductivity types, thus providing guard rings which eliminate undesired conduction of charge carriers between diffused regions of similar conductivity.

In accordance with another feature of this invention, devices are carefully structured such that MOS transistor punchthrough effects (i.e., conduction of charge carriers between source and drain regions of a transistor when that transistor is turned off) are eliminated. This is accomplished, for example, by utilizing channels of sufficient length to eliminate punchthrough between source and drain regions.

While specific embodiments of our invention have been described, it is to be understood that these embodiments are illustrative and are not be construed as limitations on the scope of our invention. Many other embodiments of our invention will become apparent to those of ordinary skill in the art in light of the teachings of our invention.

We claim:

1. A complementary metal oxide silicon push-pull output buffer, comprising:
an input node;
an output node;
a plurality of j P channel MOS transistors, where j is an integer greater than one, each of said j P channel MOS transistors having a control gate, the source of the first P channel MOS transistor being connected to a source of positive voltage V, the drain of the ith P channel MOS transistor being connected to the source of the ith+1 P channel MOS transistor, where i is an integer ranging from 1 to (j−1), and the drain of the jth P channel MOS transistor being connected to said output node;
a plurality of k N channel MOS transistors, where k is an integer greater than one, each of said k N channel MOS transistors having a control gate, a source and a drain, the source of the first N channel MOS transistor being connected to a reference potential, the drain of the Lth N channel MOS transistor being connected to the source of the Lth+1 N channel MOS transistor, where L is an integer ranging from 1 to (k−1), and the drain of said kth N channel MOS transistor being connected to said output node, wherein a set of voltages are applied to the gates of (j−1) of said P channel MOS transistors and to the gates of k−1 of said N channel MOS transistors so as to prevent a voltage in excess of the breakdown voltage from being established on each of said N channel and P channel MOS transistors when turned off, and wherein the remaining N channel and P channel MOS transistors receive control signals on their gates from said input node, said control signals applied to said input node for controlling the state of said output buffer.

2. Structure as in claim 1 wherein said output buffer has a first state
   wherein each of said N channel MOS transistors is off and each of said P channel transistors is on, whereby said source of positive voltage is applied to said output node; and
   a second state, wherein each of said N channel MOS transistors is on and each of said P channel MOS transistors is off, whereby said output node is connected to said reference potential.

3. Structure as in claim 2 wherein during said first state:
   said first P channel MOS transistor receives on its gate a first control voltage sufficient to turn said first P channel MOS transistor on and said first N channel MOS transistor receives on its gate a second control voltage sufficient to turn said first N channel transistor off, and
   wherein during said second state said first P channel MOS transistor receives on its gate a third control voltage sufficient to turn said first P channel MOS transistor off and said first N channel MOS transistor receives on its gate a fourth control voltage sufficient to turn said first N channel MOS transistor on.

4. Structure as in claim 2 wherein:
   said first P channel MOS transistor receives on its gate a bias voltage sufficient to turn said first P channel MOS transistor on; and
   wherein during said first state said first N channel MOS transistor receives on its gate a second control voltage sufficient to turn said first N channel MOS transistor off; and
   wherein during said second state said first N channel MOS transistor receives on its gate a third control voltage sufficient to turn said first N channel MOS transistor on.

5. Structure as in claim 3 or 4 wherein a voltage substantially equal to $(V(n-1)/k)$ is applied to the gates of the nth N channel MOS transistor, where n is an integer ranging from 2 to k, and wherein a voltage substantially equal to $(V(m-1))j$ is applied to the gates of the mth P channel MOS transistor, where m is an integer ranging from 2 to j.

6. Structure as in claim 5 wherein the N type bulk silicon of each said P channel MOS transistor is connected to said positive voltage.

7. Structure as in claim 5 wherein the P type bulk silicon of each said N channel MOS transistor is connected to its source.

8. Structure as in claim 5 wherein the N type bulk silicon of each said P channel MOS transistor is connected to its source.

9. Structure as in claim 5 wherein at least one of said P channel MOS transistors comprises:
   a region of N− type bulk silicon;
   a P+ type source region formed in said N− type bulk silicon;
   a P+ type drain region formed in said N− type bulk silicon; and
   a P− type region surrounding said P+ type drain region formed in said N− type bulk silicon.

10. Structure as in claim 5 wherein at least one of said N channel MOS transistors comprises:
    a region of P− type bulk silicon;
    an N+ type source region formed in said P− type bulk silicon;
    an N+ type drain region formed in said P− type bulk silicon; and
    an N− type region surrounding said N+ type drain region formed in said P− type bulk silicon.

11. A push-pull output buffer, comprising:
    an input node;
    an output node;
    two bipolar NPN transistors, both of said bipolar NPN transistors having a base, the collectors of said bipolar NPN transistors being commonly connected to a source of positive voltage V, the emitter of the first bipolar NPN transistor being connected to the base of the second bipolar NPN transistor and the emitter of the second bipolar NPN transistor being connected to said output node;
    a plurality of k N channel MOS transistors, where k is an integer greater than one, each of said N channel MOS transistors having a control gate, a source and a drain, the source of the first N channel MOS transistor being connected to a reference potential, the drain of the Lth N channel MOS transistor being connected to the source of the Lth+1 N channel MOS transistor, where L is an integer ranging from 1 to (k−1), and the drain of said kth N channel MOS transistor being connected to said output node, wherein a set of voltages are applied to the gates of (k−1) of said N channel MOS transistors so as to prevent a voltage in excess of the breakdown voltage from being established on each said N channel MOS transistor;
    wherein the remaining N channel MOS and said first bipolar NPN transistor receive on their gate and base, respectively, control signals applied to said input node for controlling the state of said output buffer.

12. Structure as in claim 11 wherein said output buffer has a first state
    wherein each of said N channel MOS transistors is off and each of said bipolar NPN transistors is on, whereby said source of positive voltage is applied to said output node; and
    a second state, wherein each of said N channel MOS transistors is on and each of said bipolar NPN transistors is off, whereby said output node is connected to said reference potential.

13. Structure as in claim 12 wherein during said first state:
    said first bipolar NPN transistor receives on its base a first control voltage sufficient to turn said first bipolar NPN transistor on and said first N channel MOS transistor receives on its gate a second control voltage sufficient to turn said first N channel transistor off, and
    wherein during said second state said first bipolar NPN transistor receives on its base a third control voltage sufficient to turn said first bipolar NPN transistor off and said first N channel MOS transistor receives on its gate a fourth control voltage sufficient to turn said first N channel MOS transistor on.

14. Structure ad in claim 13 wherein a voltage substantially equal to $(V(n-1))/k$ is applied to said gate of said nth N channel MOS transistor, where n is an integer ranging from 2 to k.

15. Structure as in claim 14 further comprising two resistors, both of said resistors connected between the base and the emitter of an associated one of said two bipolar NPN transistors.

16. Structure as in claim 14 wherein at least one of said N channel MOS transistors comprises:
 a region of P− type bulk silicon;
 an N+ type source region formed in said P− type bulk silicon;
 an N+ type drain region formed in said P− type bulk silicon; and
 an N− type region surrounding said N+ type drain region formed in said P− type bulk silicon.

17. Structure as in claim 11 wherein the P type bulk silicon of each said N channel MOS transistor is connected to its source.

* * * * *